(12) United States Patent
Pickerd

(10) Patent No.: US 7,098,839 B2
(45) Date of Patent: Aug. 29, 2006

(54) FLASH ARRAY DIGITIZER

(75) Inventor: John J. Pickerd, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 51 days.

(21) Appl. No.: 10/861,334

(22) Filed: Jun. 3, 2004

(65) Prior Publication Data

US 2005/0273284 A1    Dec. 8, 2005

(51) Int. Cl.
*H03M 1/36* (2006.01)

(52) U.S. Cl. .................. 341/158; 341/141; 702/67; 377/42

(58) Field of Classification Search ............ 341/158, 341/159, 160; 377/37, 42; 702/67, 70
See application file for complete search history.

(56) References Cited

U.S. PATENT DOCUMENTS

| | | | |
|---|---|---|---|
| 4,833,445 A * | 5/1989 | Buchele ............ | 341/118 |
| 5,343,405 A | 8/1994 | Kucera et al. | |
| 5,552,999 A * | 9/1996 | Polgreen et al. ........ | 702/63 |
| 5,691,664 A * | 11/1997 | Anderson et al. ....... | 327/565 |
| 6,169,503 B1 * | 1/2001 | Wong ................ | 341/136 |
| 6,859,375 B1 * | 2/2005 | Breton et al. .......... | 365/45 |
| 2004/0008160 A1 * | 1/2004 | Etheridge et al. ...... | 345/30 |

FOREIGN PATENT DOCUMENTS

JP    56164629 A  * 12/1981

* cited by examiner

Primary Examiner—Howard L. Williams
(74) Attorney, Agent, or Firm—Moser, Patterson, Sheridan LLP; Thomas F. Lenihan

(57) ABSTRACT

Apparatus for rapidly acquiring a large number of samples of a signal under test, stores the samples in a waveform memory without converting the samples to binary form. The signal under test is applied to an arrangement of comparators and exclusive-OR gates to provide a signal indicative of amplitude. The waveform memory is arranged in rows and columns. In one embodiment, the amplitude-indicative signal serves as a row address signal for the waveform memory, and a scanning control signal serves as a column address signal for the waveform memory. In another embodiment, an X-Y display is produced in which the column address signal is responsive to the amplitude of a second signal under test.

24 Claims, 3 Drawing Sheets

FLASH ARRAY DIGITIZER

FIELD OF THE INVENTION

The invention relates generally to signal analysis devices and, more particularly, to an apparatus for rapidly acquiring large numbers of samples.

BACKGROUND OF THE INVENTION

Within the context of test and measurement instruments such as digital storage oscilloscopes (DSOs) and the like, signals under test (SUT) are digitized using an analog to digital (A/D) converter to provide sample data suitable for further processing, such as waveform generation. Several types of A/D converter configurations are in wide use, such as, successive approximation, fast-in slow-out (FISO) and flash (A/D) converters. The typical flash converter consists of a set of comparators that produce a "thermometer code" output. This is then converted with several levels of combinational logic directly into a binary number value that represents one sample. FISO A/D converters store samples in a bank of capacitors. One acquisition is obtained at a high sample rate, then the charges are multiplexed out at a slower rate to a conventional A/D converter.

In typical oscilloscope architectures, speed of conversion is sacrificed in order to reduce power requirements. Pipelining techniques are sometimes used to regain some of the lost speed. In order to obtain very high sample rates, multiple A/D converters may be interleaved. The FISO approach requires the use of a complex timing and correction algorithm that is applied to the data after it is digitized.

Current oscilloscope digitizers have equivalent time and interleave modes of operation. Binary samples from digitized SUTs are stored in large circular waveform memories. Acquiring a waveform requires interaction from a system processor that manages the resetting of hardware registers as well as the computing of trigger positions and the unloading of wrapped waveforms in the circular memory. As a result, the dead time between trigger events can be very large.

SUMMARY OF INVENTION

Various deficiencies of the prior art are addressed by the present invention of a method and apparatus for rapidly acquiring large amounts of data. The invention advantageously allows rapid data acquisition as well as the storage of large amounts of data without requiring continuous interaction with a system processor.

The subject invention is adapted, in one embodiment, to an apparatus comprising a plurality of comparators, each of the comparators responding to excursions of a signal under test (SUT) beyond a respective one of a sequence of threshold levels; a plurality of logic elements, each of the logic elements processing the output signals of two comparators having adjacent threshold levels within the sequence of threshold levels; an array of counters, each counter in the array of counters being responsive to one of the logic elements during a selection of a corresponding column; and a sweep mechanism, for sequentially selecting individual columns of the array of counters; wherein each time a column of counters is selected, no more than one counter in the selected column of counters responds to its corresponding logic element.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

The subject invention will be primarily described within the context of a digital storage oscilloscope (DSO). However, it will be appreciated by those skilled in the art that the invention may be advantageously employed in any signal analysis device in which an input signal is digitized prior to further processing.

Figure 1:
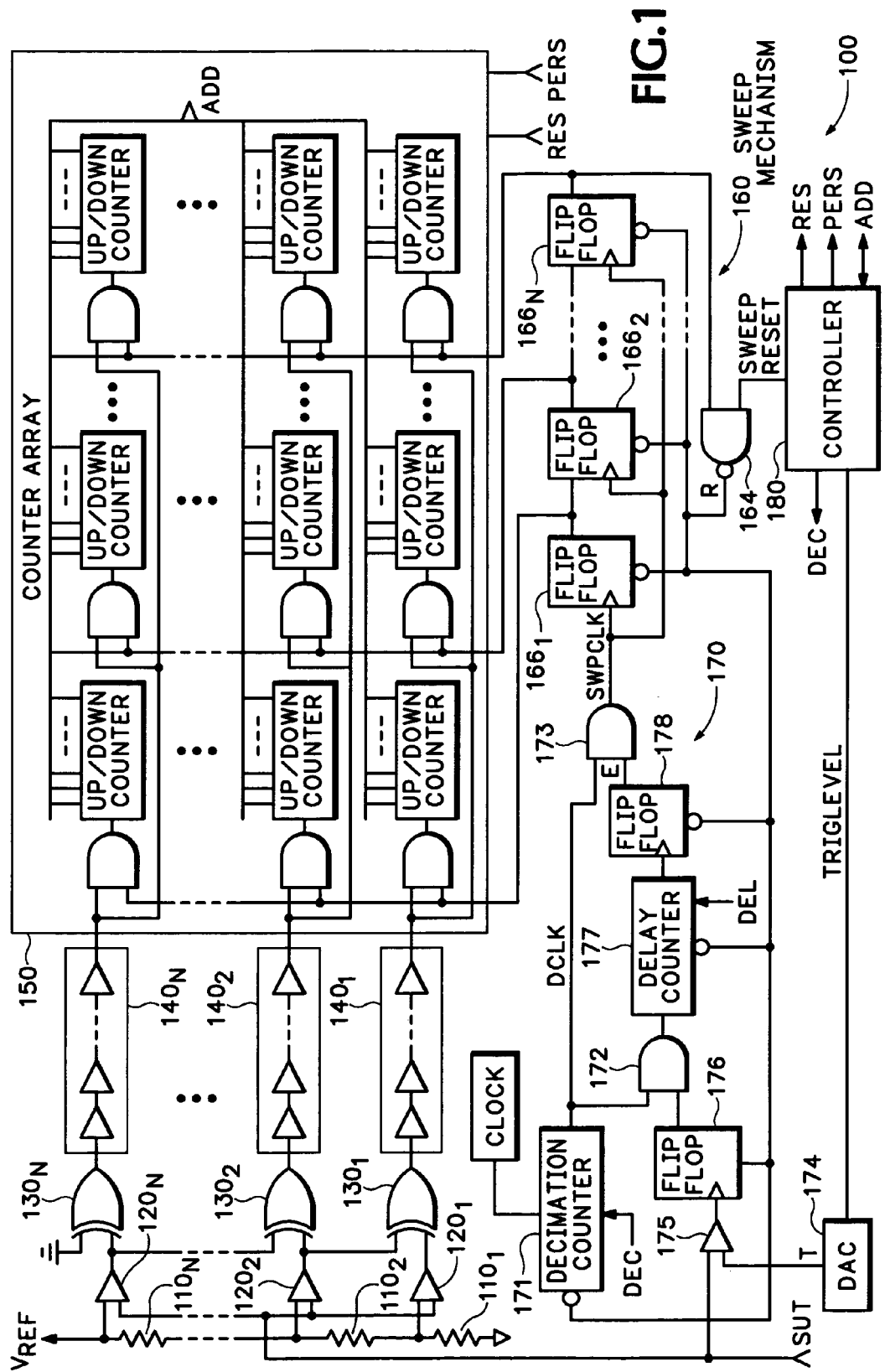
FIG. 1 depicts a high level block diagram of a flash array digitizer according to an embodiment of the present invention.

FIG. 1 depicts a high level block diagram of a flash array digitizer (FAD) according to an embodiment of the present invention. The FAD 100 of FIG. 1 is suitable for use as a signal acquisition portion of a test and measurement device, such as a digital storage oscilloscope (DSO), logic analyzer and the like. The FAD 100 of FIG. 1 operates to digitize a signal under test (SUT) in a manner avoiding the use of a conventional A/D converter. While not specifically shown, it will be appreciated by those skilled in the art that the SUT has been subjected to various signal conditioning operations, such as buffering and scaling a maximum SUT voltage level to substantially match a reference voltage level ($V_{REF}$) used by the FAD and, optionally, the use of sample and hold circuitry.

The FAD 100 of FIG. 1 comprises a plurality of resistors $110_1$ through $110_N$ (collectively resistors 110) forming a voltage divider, a plurality of comparators $120_1$ through $120_N$ (collectively comparators 120), a plurality of logic elements $130_1$ through $130_N$ (collectively logic elements 130), a plurality of delay lines $140_1$ through $140_N$ (collectively delay lines 140), an N×M array of counters 150, a sweep mechanism 160, a trigger mechanism 170, and a controller 180.

The resistors 110 are arranged in a series connection between the voltage reference $V_{REF}$ and a ground point GND to form thereby a voltage divider. The series connection of N resistors operates to divide the voltage reference $V_{REF}$ into N reference signal portions. The N reference portions form a sequence of voltage levels of increasing voltage level from $V_{REF}/N$ to $V_{REF}$. The resistor voltage divider discussed herein is but one means for generating a plurality of voltage levels. Other means are known to those skilled in the art, such as diode arrays, special purpose voltage reference sources and the like. Generally speaking, any method or technique suitable for generating a plurality of threshold levels for driving the various comparators may be used.

Each of the N voltage reference portions are applied to the non-inverting input of a corresponding comparator 120, while the SUT is applied to the inverting input of each of the comparators 120. Thus, a comparator 120 provides a positive output signal when the voltage level of the SUT exceeds the reference signal associated with a comparator. As the voltage level of the SUT increases, the number of comparators providing "true" or "high" outputs increases (beginning with first comparator $120_1$ and continuing up through final comparator $120_N$ as the SUT voltage level approaches $V_{REF}$).

The output of first comparator $120_1$ is coupled to a first input of first logic element $130_1$. The output of second comparator $120_2$ is connected to a second input of first logic element $130_1$ and a first input of second logic element $130_2$. Similarly, the output of the third comparator $120_3$ is connected to a second input of second logic element $130_2$ and a first input of third logic element $130_3$. This connection pattern continues through the remainder of the comparators 120 and logic elements 130 up to the Nth comparator 120 and Nth logic element 130, where the output of Nth comparator $120_N$ is connected to a first input of Nth logic element $130_N$, and a second input of Nth logic element $130_N$ is connected to a low or zero logic level (representing false), shown in FIG. 1 as ground.

As described above, each of the logic elements 130 (illustratively XOR gates) receives as its two inputs a signal from each of two comparators having associated with them adjacent threshold levels within the sequence of threshold levels. Thus, as the SUT increases in voltage level, the number of comparators providing a logic high output signal increases. The one XOR gate receiving a signal from a comparator producing a logic high output and a comparator producing a logic low output will produce as its output a logic high. All other XOR gates 130 will produce logic low output signals since they are coupled to either comparators having threshold levels that are all above or all below the level of the SUT.

Each of the logic elements $130_1$ through $130_N$ provides its output signal to a corresponding row (1 through N) within the counter array 150 either directly or optionally via corresponding delay line elements $140_1$ through $140_N$. The delay line elements 140 operate to impart a delay to the logic element output signals. The delay imparted may be substantially zero or some other amount of time. The delay may be selectable and is used, in one embodiment, to ensure that a subsequent display of the digitized signal includes portions of the signal preceding a triggering event.

The counter array 150 comprises an N×M array of counters (i.e., N rows and M columns). Each cell or counter within the counter array 150 comprises, illustratively, an up/down counter that receives an increment/decrement signal via a respective AND gate, where the AND gate serves as an addressing element. Other counter cell addressing techniques may be used. The sweep mechanism 160 operates to select one of the M columns at a given moment. Thus, a counter is incremented (or decremented) only when its corresponding column is selected via the sweep mechanism 160 and its row is in a high state via the (optionally delayed) output of the corresponding logic element 130. The counter array 150 forms, in effect, a waveform database of N×M counters. In one embodiment of the invention, the waveform database described herein is implemented substantially in accordance with U.S. Pat. No. 5,343,405, which is incorporated herein by reference in its entirety.

Specifically, it is configured as a two dimensional array where each counter represents a picture element (pixel) position in a waveform display. A waveform sample is recorded by incrementing the appropriate counter in the array that represents the vertical and horizontal position of the corresponding sample of the waveform. Rows in the array are enabled by the output of the logic element representing the vertical level of the analog input signal, while columns in the array are selected via the sweep mechanism 160. Thus, the FAD of the present invention directly maps samples into a waveform database (i.e., the counter array) without ever converting the samples into a binary format. In this manner, the FAD requires no processor intervention while acquiring multiple waveforms. Stated differently, the FAD does not use a standard memory in the sense that it does not have an input address bus or a data bus to input samples; rather, the FAD waveform database comprises an array of hardware counters where clocking a counter (i.e., incrementing or decrementing) is equivalent to storing a sample at the waveform database portion represented by the counter. The samples stored in the sample array may be accessed by a controller via an output data/address bus configuration.

In a YT configuration, the sweep mechanism 160 utilizes a clock and ring counter to generate a "horizontal sweep" similar in effect to an analog scope horizontal sweep operation. An AND gate is connected into each flip flop so that when both a row and column are enabled simultaneously, the corresponding counter is clocked or incremented, thereby recording one sample. In an XY configuration, another set of comparators and logic elements are used to select the columns in place of the ring counter sweep logic. The cycle time of the ring counter may be relatively long since a particular flip flop will not be clocked again until the next sweep occurs. Thus, the counters in the array may have a settling time that is long compared to the count pulse that clocked it. Thus, the counter array may provide output data via a standard bus configuration accessed using a system processor. In an alternate embodiment, the counters are implemented with a dual function to operate as counters for input purposes and shift registers for output purposes.

Normally in a waveform display, each pixel is illuminated for a period of time unless refreshed. The decay in luminance or intensity level of the pixel over time absent such a refresh is referred as the persistence. In one embodiment of the invention, the persistence parameter associated with the pixels represented by the counters is addressed using a persistence control signal PERS. The persistence control signal causes the counters to decrement a set amount of counts for a predetermined time period. In this embodiment, the counters within the counter array are implemented as up/down counters, rather than standard counters. In an alternate embodiment of the invention, the counters within the counter array are implemented as standard "up" counters which are reset to zero after being unloaded. That is, the counters acquire data for some period of time, which data is then retrieved by the controller 180 for further processing and/or display. Upon retrieving the data, the controller 180 causes the counters within the counter array 150 to be zeroed or reset via a reset control signal RES.

In a free running state, the sweep mechanism continually selects columns of counters within the counter array 150 as the logic element 130 associated with the present SUT voltage level provides a high output signal to its corresponding row of counters within the counter array 150. Thus, the sweep mechanism 160 operates as a time base selection function within the context of a DSO, while the voltage divider 110, comparators 120 and logic elements 130 operate as a voltage level function.

The counter array 150 receives a reset control signal RES and a persistence count down signal PERS from the controller 180. In response to the reset signal RES, the count of each counter within the count array is reset to a predetermined level, such as zero or midrange. In response to the persistence count down signal PERS, the count of each counter within the counter array is decremented by a predetermined amount such as one or two counts. Thus, the counters within the counter array are incremented as discussed above to generate data representative of a waveform. Similarly, the counters are decremented according to a controlled persistence value such that new data may be processed. Each of the cells within the counter array 150 may be associated with a respective picture element (pixel) on a display device (not shown).

In one embodiment of the invention, a 200 row times 500 column counter array is utilized at a sample rate of 5 Gigasamples per second (GS/s). In this manner, it is possible that 90% to almost 100% of the signal provided by the SUT is actually acquired. The acquired samples associated with the SUT are mapped directly into the waveform database (i.e., counter array) without ever converting them to a binary format. As previously noted, this is because clocking a counter is equivalent to storing a sample. While not shown directly, the contents of each of the counters are accessed via an address bus ADD using the controller 180.

In one embodiment of the invention, a 500×500 counter array is utilized wherein each counter comprises a 10 bit counter. This array can record a total of 256 million samples.

In the embodiment of FIG. 1, the sweep mechanism 160 illustratively comprises a ring counter. Other column selection techniques may also be used (e.g., ripple-counters, address selectors, mux/demux processors and the like). In one embodiment of the invention, the sweep mechanism 160 comprises a divide by N counter which receives a clock signal (e.g., the sweep clock signal SWPCLK) and responsively produces an output count. The output count is coupled to a demultiplexer which produces a predefined logic state on one of M outputs, which outputs are used to drive the respective 1 through M column selections within the counter array 150.

In the embodiment depicted in FIG. 1, the sweep mechanism/ring counter 160 comprises a plurality of flip-flops, illustratively D-type, RS type or other flip-flops $166_1$ through $166_M$ (collectively sweep flip-flops 166). This time base ring counter is used to address the columns of the counter array. The ring counter comprises one flip-flop for each column in the array, and only one flip-flop at a time has a high output. The high output signal is "passed" from one flip-flop to the next on each clock cycle at a desired sample rate. The output of the last flip flop (i.e., $166_M$) is fed back to reset the trigger flip-flops and counters. Thus, the system is rearmed in a fraction of a clock interval and ready to start the next sweep with no intervention from a system processor. As a result, waveform capture rates close to 10 M waveforms per second on each channel can be attained.

The sweep flip-flops 166, in response to a clock signal SWPCLK operate to propagate a single bit between the outputs of first sweep flip-flop $166_1$ through $M^{th}$ sweep flip-flop $166_M$. Each of the sweep flip-flops 166 is coupled to the counter array gating elements of a corresponding column of counters (e.g., the AND gate associated with each counter in the column). Thus, the sweep flip-flops 166 operate to sweep through or select in turn each of the M columns within the counter array 150 over a period of time T. The sweep time is determined by a decimated clock signal DCLK generated within the trigger mechanism 170. The sweep mechanism 160 includes a first logic element 164, illustratively a NAND gate which inhibits the sweeping function of the sweep flip-flops in response to a sweep reset signal SWEEPRESET provided by the controller 180.

The trigger mechanism 170 comprises, illustratively, a decimation counter 171, a first logic element 172, a second logic element 173, a D/A converter 174, a trigger comparator 175, a first flip-flop 176, a delay counter 177 and a second flip-flop 178.

The trigger mechanism 170 receives a clock signal CLOCK which is processed by the decimation counter 171 to produce a decimated clock signal DCLK. The decimation counter 171, in response to a control signal DEC produced by the controller 180, operates to decimate or divide the clock signal CLOCK (if desired) to produce the decimated clock signal DCLK, which is coupled to the second logic element 173 along with a clock enable signal E. The control signal DEC may comprise, illustratively, a digital word that is loaded into a latch (not shown) associated with the decimation counter 171. The latched word determines the modulo value for the decimation counter 171, which determines the decimation ratio of the output of the most significant bit of the counter with respect to the clock input of the counter.

The digital to analog converter 174, in response to a control signal TRIGLEVEL provided by the controller 180 operates to generate a trigger reference signal T. The trigger comparator 175 receives the trigger reference signal T and the SUT and, in response to excursions of the SUT above the trigger reference signal T, provides an enabling signal to the first flip-flop 176. The output of first flip-flop 176 is coupled to the first logic element 172 along with the output of the decimation counter 171. First logic element 172, illustratively an AND gate, provides an enabling signal to the delay counter 177 when a decimated clock signal DCLK and first flip-flop 176 provide appropriate outputs (e.g., true outputs where first logic element 172 comprises an AND gate).

The delay counter 177, in response to a control signal DEL produced by the controller 180, operates to delay the transmission of the decimated clock signal DCLK to the second flip-flop 178. That is, the delay counter is programmable using the controller 180 to count down a delay started by output from the trigger comparator 175. The control signal DEL may comprise, illustratively, a digital word that is loaded into a latch (not shown) associated with the delay counter 177. The latched word determines how far the delay counter 177 will count to determine the length of the delay interval.

At the end of the delay count, the first flip-flop 176 is set such that the time base or decimator clock DCLK is allowed to pass to the sweep mechanism 160. Upon receiving the delayed decimated clock signal DCLK, a second flip-flop 178 provides that signal to the second logic element 173 as the enable signal E. It is noted that the decimation counter 171, flip-flops 176, 178 and delay counter 177 are all responsive to a reset signal R generated using the sweep reset signal of the controller 180.

The trigger mechanism 170 described herein is described with respect to specific circuitry. However, it will be appreciated by those skilled in the art that the functionality of the trigger mechanism 170, as with the functionality of the sweep mechanism 160, may be implemented using a number of techniques. Generally speaking, the trigger mechanism 170 operates to establish a trigger threshold level (via the D/A converter 174), which trigger level is used to enable the storage of data (i.e., incrementing) of cells within the counter array 150. Optional functionality includes the delay processing which helps to temporally align trigger events and data acquisition such that a subsequent display of the acquired data is presented or displayed to a user in a more easily understood or recognizable form.

The controller 180 comprises a processor, memory and input/output circuitry (not shown) suitable for controlling and otherwise implementing the various control signals described herein.

Figure 2:
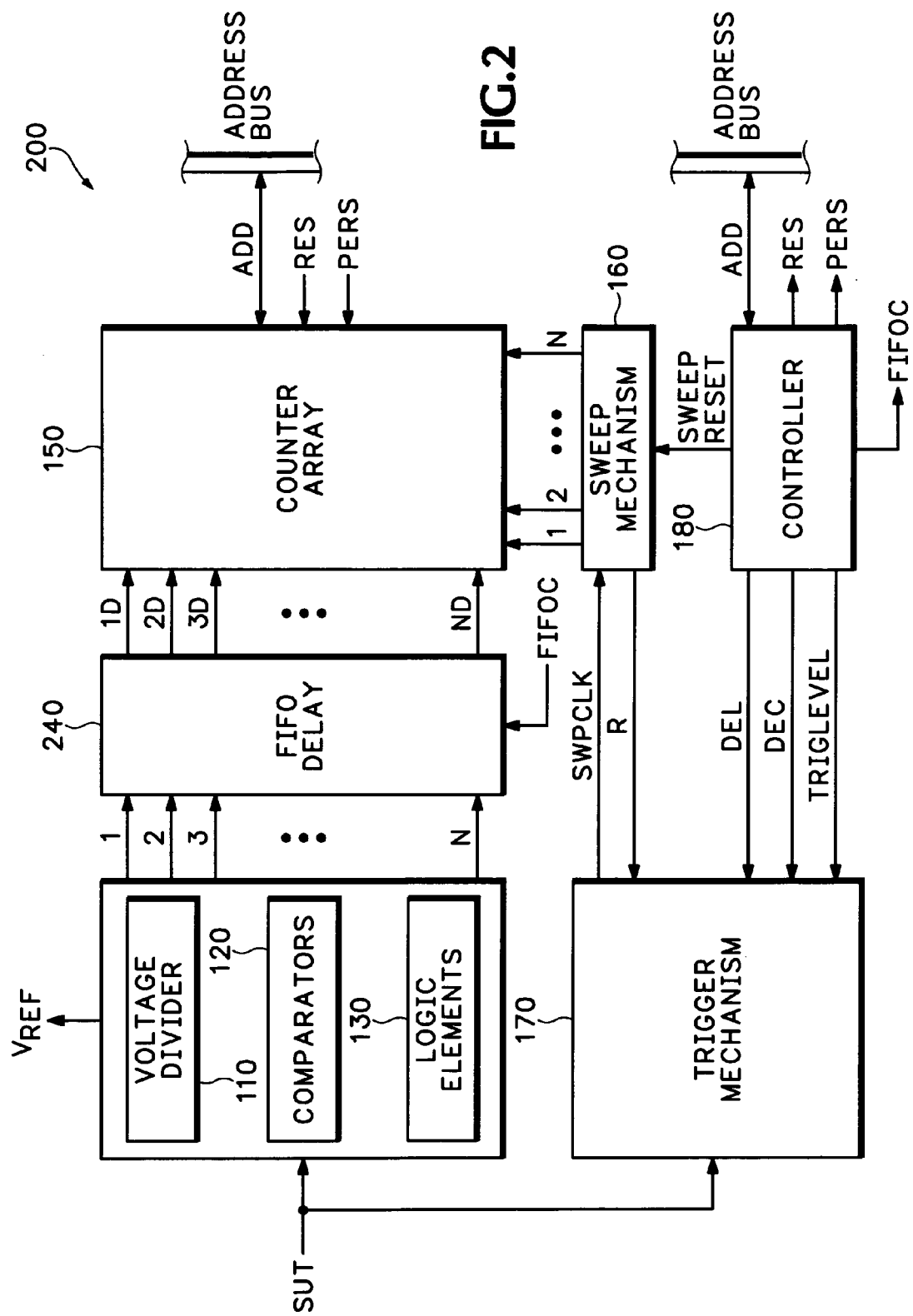
FIG. 2 depicts a high level block diagram of an embodiment of the present invention.

FIG. 2 depicts a high level block diagram of an embodiment of the present invention. Specifically, FIG. 2 depicts high level block diagrams of the various functional elements discussed above with respect to FIG. 1. In the embodiment 200 of FIG. 2, the delay line array 140 is replaced by a first-in first-out delay module 240. Optionally, the FIFO delay mechanism 240 is responsive to a control signal FIFOC produced by the controller 180. The controller 180 utilizes the control signal FIFOC to enable a delay, adjust a delay and the like.

The embodiments of the present invention discussed above with respect to FIGS. 1 and 2, generally describe a YT flash array digitizer (i.e., vertical or "Y" displacement and time). Modifications of the Y key flash array digitizer are discussed herein, such as modifications to the sweep mechanism 160, trigger mechanism 170, delay mechanisms 140, 240 and the like. In an alternate embodiment of the invention, an XY flash array digitizer is provided. In this embodiment, the sweep mechanism 160 comprises a voltage divider, comparator and logic element array such as discussed above with respect to the voltage divider 110, comparators 120 and logic elements 130. Rather than a signal under test (SUT), the XY flash array digitizer receives a Y input signal and an X input signal. The Y input signal is processed substantially in the manner described above with respect to the SUT. The X input signal is processed via a set of comparators and logic elements to drive the M column selectors. Thus, as the Y input signal varies, one of the logic elements 130 provides a high output signal which is coupled to a corresponding row within the counter array. Similarly, as the X input signal varies, one of the logic elements within this modified sweep mechanism 160 provides a high output which is coupled to a respective one of the M columns of the counter array. The X input signal may comprise a ramp function which operates to sweep through the various columns. The ramp function may be modified in terms of period to increase or decrease the amount of time required to select all columns. The ramp function may also be modified in terms of magnitude such that not all columns are selected. The Y input signal is also processed via a trigger mechanism 170 as described above. In addition, the trigger mechanism 170 may be modified to include blanking circuitry such that there is no incrementing of counters within the counter array 150 while the X input signal returns to an initial state (i.e., the trailing or high to low transition of a ramp function).

Figure 3:
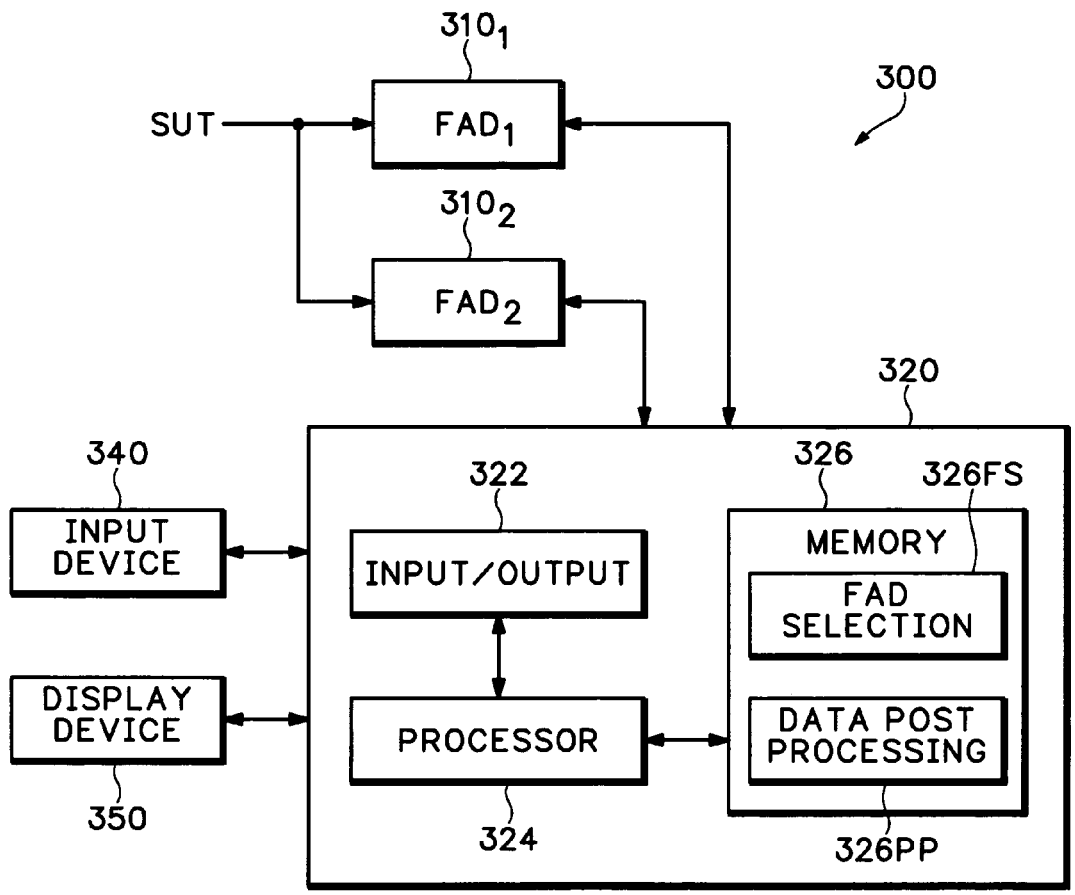
FIG. 3 depicts a test and measurement system according to an embodiment of the present invention.

FIG. 3 depicts a test and measurement system according to an embodiment of the present invention. Specifically, the system 300 of FIG. 3 comprises a first FAD 310$_1$, a second FAD 310$_2$, a controller 320, an input device 340 and a display device 350. The system 300 of FIG. 3 may comprise, illustratively, a digital storage oscilloscope (DSO), logic analyzer or other signal test and measurement device. The system 300 of FIG. 3 is depicted as receiving one signal under test (SUT), which SUT is processed by each of the FADs 310$_1$ and 310$_2$. However, it will be appreciated by those skilled in the art that multiple signals under test may be provided and that the more or fewer than two FADs 310 may be utilized to process each received SUT. Moreover, in one embodiment of the invention, the controller 320 may allocate more or fewer FADs 310 to the processing of higher priority or more complex signals under test.

Within the context of the embodiment 300 of FIG. 3, the FADs 310 operate in a capacity interleaved manner. That is, when one FAD has a counter array reaching a threshold or saturation level, the data from that FAD is retrieved or unloaded by the controller 320. While that data is being retrieved from the first FAD 310, the second FAD begins acquiring data from the SUT. In this manner, a first FAD acquires data while a second FAD provides its previously acquired data to the controller. Assuming the time it takes to provide data to the controller is less than the time it takes for an FAD to reach its saturation point, two FADs may "ping-pong" to alternatively acquire and unload data. If the data cannot be unloaded quickly enough, more FADs may be used to acquire while other FADs are unloading.

The controller 320 is used to manage the various operations of the system 300 of FIG. 3. The controller 320 performs various processing and analysis operations on the data samples stored within the counter arrays 150 of the FADs 310. The controller 320 receives user commands via an input device 340 (illustratively a keypad or pointing device). The controller 320 provides image-related data to a display device 350, illustratively a cathode ray tube (CRT), liquid crystal display (LCD) or other display device.

As previously noted with respect to FIGS. 1 and 2, each of the FADs 310 is associated with a controller 180. The controller 180 may be an individual controller providing control functionality for a single FAD, or the control function may be provided by the controller 320 within the context of a system-level controller. In either case, the sample storage function operates in an autonomous fashion with respect to the controller. The controller merely provides reset signaling, trigger control functions and data read functions for use within the FAD.

The controller 320 comprises input/output circuitry 322, processor circuitry 324 and memory circuitry 326. The processor 324 also cooperates with conventional support circuitry such as power supplies, clock circuits, cache memory and the like (not shown) as well as circuits that assist in executing the software routines stored in the memory 326. As such, it is contemplated that some of the process steps discussed herein as software processes may be implemented within hardware, for example as circuitry that cooperates with the processor 324 to perform various steps. The input/output (I/O) circuitry 322 forms an interface between the various functional elements communicating with the controller 320. For example, in the embodiment of FIG. 3, the controller 320 communicates with the FADs 310 (e.g., via an address bus to retrieve stored counter array data), the input device 340 (to retrieve input commands) and the display device 350 (to transmit image representative signals).

The memory 326 is depicted as storing a FAD selection routine 326-FS and a data post processing routine 326PP. The FAD selection routine 326-FS is used to implement, for example, the ping-pong operation with the two FADs 310$_1$ and 310$_2$. The data post processing route 326PP comprises those steps appropriate to processing data retrieved from an FAD such that the processed data may be subsequently displayed. Additional post processing steps include smoothing, filtering and other functions adapted to reducing spurious effects within the data and other anomalies. It will be appreciated by those skilled in the art that since an FAD is capable of capturing virtually all of the data surrounding a triggering event, some of the data captured may not be appropriate to the test and measurement function desired. As such, the post processing routines may comprise standard post processing routines used in test and measurement instruments such as the various filtering routines (box car filtering, low pass filtering, high pass filtering, and the like) adapted to provide waveform imagery appropriate to a particular test and measurement function.

Figure 4:
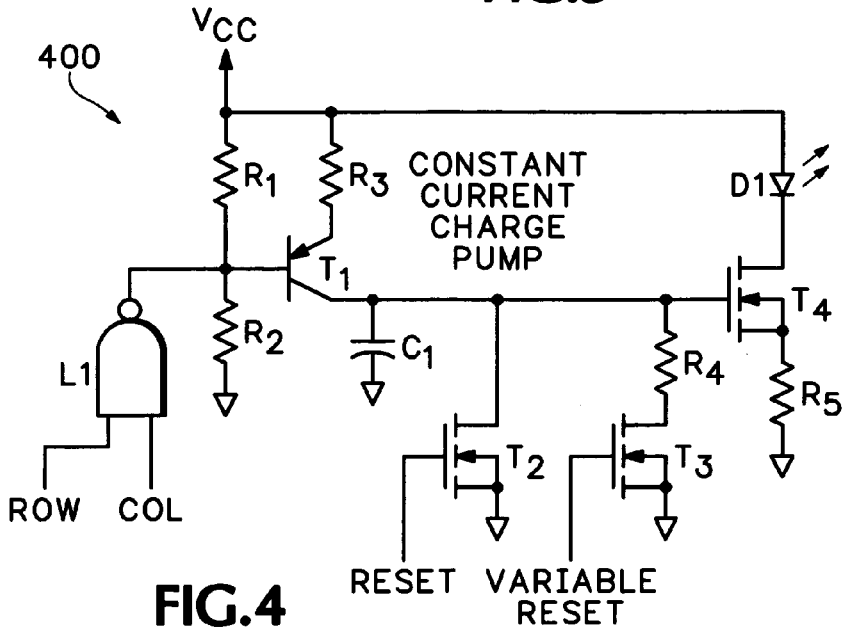
FIG. 4 depicts a schematic diagram of a storage cell according to an embodiment of the present invention.

FIG. 4 depicts a schematic diagram of a storage cell according to an embodiment of the present invention. Specifically, in one embodiment of the invention the counter array 150 of the flash array digitizer described above is realized using an array of cells similar in functionality to the storage cell 400 of FIG. 4. That is, each counter and addressing AND gate in the counter array 150 is replaced with a circuit having a functionality such as described herein with respect to FIG. 4.

The storage cell 400 of FIG. 4 stores a sample as an increment of charge on a capacitor. A (illustratively) MOSFET buffer is used to illuminate an LED with an intensity proportional to the number of charge increments stored on the capacitor. A constant current charge pump is used to deposit increments of charge on the capacitor. In this manner, the storage cell circuit 400 of FIG. 4 behaves in a manner similar to a phosphor in a standard cathode ray tube oscilloscope.

Referring now to FIG. 4, the cell 400 comprises a plurality of resistors R1–R5, a logic element L1 (illustratively a NAND gate), a capacitor C1, a plurality of transistors T1–T4 and a light emitting diode D1.

The NAND gate L1 receives row and column addressing information and responsively provides an output signal to a junction of the first two resistors R1 and R2, which resistors are connected in series between a voltage source VCC and ground. The junction point of the R1/R2 connection is also coupled to the base of transistor T1, illustratively a PNP transistor. The emitter of transistor T1 is coupled to VCC via resistor R3, while the collector of transistor T1 is coupled to ground via capacitor C1.

The circuit described thus far operates to increase the charge imparted to capacitor C1 each time the row/column addressing scheme enables the flow of current through transistor T1. Since current only flows during the time interval in which the row/column combination for the particular cell is enabled or true, the amount of current imparting charge to capacitor C1 is controlled. It is noted that the values of resistors R1, R2 and R3 are selected to provide appropriate biasing of transistor T1, as well as an appropriate amount of current for capacitor C1.

The charge stored by capacitor C1 is observed as a voltage level at the collector of transistor T1, where $v(t)=it/C$ when $i$ is constant. The collector of transistor T1 is also coupled to the gate of transistor T4. A circuit is formed between VCC and ground of LED D1 (in a forward biased orientation), the drain and source of transistor T4 and resistor R5. Resistor R5 is selected to appropriately limit the current through LED D1. As the amount of charge stored in capacitor C1 incrementally increases, the bias voltage applied to the gate of transistor T4 also incrementally increases. As the gate voltage incrementally increases, the amount of current flowing through LED D1 also incrementally increases making the resulting emitted light brighter. Thus, the circuit operates to increase the charge stored by capacitor C1 each time the cell is correctly addressed, which increase in stored charge causes an increase in bias voltage applied to transistor T4, which increase in bias voltage leads to increased intensity level in the output of LED D1. As previously noted, the row/column addressing is accomplished using the output of the logic elements 130 in conjunction with the sweep mechanism 160. The voltage across the capacitor represents the number of times that the input waveform has "hit" or caused an access of the particular cell (i.e., correspondence of the cell's logic element and time interval). For example, if each charge interval the capacitor is subjected to increased the voltage by 0.01 volts, and the capacitor at some point in time had 0.1 volts across it, then 10 occurrences of the waveform at that position in the array has occurred. Thus the capacitor behaves like a digital counter where the capacitor voltage is directly proportional to the counts.

The reset control is implemented using transistor T2 which, in response to the reset signal RES received at its gate, applies substantially a short circuit to capacitor C1 thereby discharging it. The variable persistence function is implemented by the series combination of resistor R4 and transistor T3 coupled across capacitor C1. In response to the variable persistence control signal PER, transistor T3 allows capacitor C1 to be discharged according to the RC time constant of capacitor C1 and resistor R4.

The cell 400 of FIG. 4 is described as having certain components. However, it will be appreciated by those skilled in the art that various other components may be utilized to achieve substantially the same function. For example, transistors used may be bipolar, FET, MOSFET and the like. In one embodiment, each of the transistors is of the same type such that circuit fabrication is simplified. Additionally, circuitry for controlling the brightness and contrast values for the LED may be provided.

The storage cell configuration of FIG. 4 advantageously displays a waveform directly from the plurality of LEDs incorporated into the flash array. In one embodiment of the invention, the circuit is utilized within the context of a hand held (e.g., battery operated) display unit. In this embodiment, a simplified, hand held oscilloscope is provided in which the display requires no major processor system, only a minimal amount of processing as described herein with respect to the controller function 180. In this manner, a simple monitoring type of instrument is inexpensively and portably provided to enable thereby quick performance checks of systems in the field or elsewhere.

The above-described apparatus and methods of the present invention advantageously provide for very high speed acquisition of large amounts of data without the need for sample and hold circuits, A/D converters and the like. This is because the complete storage of a sample is initiated during a single sample interval when the signal is present for the interval or instance that the horizontal sweep correlates to a given horizontal position. This is also valid even when multiple FADs are used in an interleaved mode. However, sample/hold circuitry may be used in various embodiments of the invention if the frequency roll off effects of operation without it are to be avoided. That is, frequency roll off effects may be reduced at the front end using sample/hold circuitry or at the back end using post acquisition processing by, for example, the controller 180 or controller 320.

In one embodiment of the invention, additional delay logic is implemented in the row and column read/write logic associated with the counter array to compensate for different signal path lengths and delays.

While the foregoing is directed to the preferred embodiment of the present invention, other and further embodiments of the invention may be devised without departing from the basic scope thereof, and the scope thereof is determined by the claims that follow.

What is claimed is:

1. Apparatus, comprising:
a plurality of comparators, each of said comparators responding to excursions of a signal under test (SUT) beyond a respective one of a sequence of threshold levels;
a plurality of logic elements, each of said logic elements processing the output signals of two comparators having adjacent threshold levels within said sequence of threshold levels;
an array of counters, each counter in said array of counters being responsive to one of said logic elements during a selection of a corresponding column; and
a sweep mechanism, for sequentially selecting individual columns of said array of counters during a corresponding sweep time interval; wherein
each time a column of counters is selected, no more than one counter in said selected column of counters responds to its corresponding logic element.

2. The apparatus of claim 1, further comprising:
a divider, for dividing a reference signal into a plurality of reference signal portions, said reference signal portions defining said sequence of threshold levels.

3. The apparatus of claim 1, wherein:
each counter within said counter array has associated with it a count representing at least a luminance level of a corresponding picture element (pixel).

4. The apparatus of claim 1, wherein:
each counter in said array is incremented in response to said SUT exhibiting a corresponding signal level during a corresponding sweep time interval; and
each counter in said array is decremented in response to a periodic decrement signal.

5. The apparatus of claim 1, further comprising:
a display device, for displaying imagery associated with at least a portion of said counter array, wherein each counter within said counter array has associated with it a count, said count representing at least a luminance level of a corresponding picture element (pixel).

6. The apparatus of claim 5, wherein:
each counter in said array is periodically decremented.

7. The apparatus of claim 1, wherein:
said sweep mechanism comprises a ring counter responsive to a clock signal.

8. The apparatus of claim 1, wherein:
said sweep mechanism is enabled for operation by a trigger mechanism, said trigger mechanism enabling said clock signal in response to SUT excursions beyond a threshold level.

9. The apparatus of claim 1, further comprising:
a plurality of delay elements, each of said delay elements operating to delay a signal passing between a logic element and its corresponding row of counters.

10. The apparatus of claim 9, wherein:
each of said delay elements comprises a sequence of logic elements.

11. The apparatus of claim 9, wherein:
each of said delay elements comprises a first in-first out (FIFO) buffer.

12. The apparatus of claim 9, further comprising:
a trigger mechanism, for selectively enabling the each of said delay elements comprises a first in-first out (FIFO) buffer.

13. Apparatus, comprising:
a plurality of comparators, each of said comparators responding to excursions of a signal under test (SUT) beyond a respective one of a sequence of threshold levels;
a plurality of logic elements, each of said logic elements processing the output signals of two comparators having adjacent threshold levels within said sequence of threshold levels;
an array of storage cells, each storage cell in said array of storage cells being responsive to one of said logic elements during a selection of a corresponding column;
a sweep mechanism, for sequentially selecting individual columns of said array of storage cells during a corresponding sweep time interval; wherein each time a column of storage cells is selected, no more than one storage cell in said selected column of storage cells responds to its corresponding logic element; and
wherein said array of storage cells comprises an array of capacitors;
each capacitor in said array has a respective charge level that is incrementally increased in response to said SUT exhibiting a corresponding signal level during a corresponding sweep time interval.

14. The apparatus of claim 13, wherein:
the charge level for each capacitor in said array is decreased in response to a common control signal.

15. Apparatus, comprising:
two flash array digitizers (FADs), each of said FADs comprising a respective N×M array of counters, wherein each of N rows has associated with it a corresponding SUT level, each of M columns has associated with it a sweep time interval, each counter in said array being incremented in response to said SUT exhibiting a corresponding SUT level during a corresponding sweep time interval; and
a controller, for selectively enabling one of said FADs to acquire SUT samples while extracting previously acquired samples from the other FAD.

16. The apparatus of claim 15, wherein:
after extracting said previously acquired samples from an array, said controller resets said array.

17. The apparatus of claim 15, wherein:
each of said counters within said N×M counter arrays is associated with a picture element (pixel) on a display device.

18. The apparatus of claim 15, further comprising:
a display device, for displaying imagery associated with at least a portion of one counter array, wherein each counter within said counter array has associated with it a count, said count representing at least a luminance level of a corresponding picture element (pixel).

19. Apparatus, comprising:
an N×M array of counters, wherein a counter is incremented in response to a signal under test (SUT) exhibiting a corresponding one of N threshold levels during a corresponding one of M sweep intervals;
a plurality of exclusive OR (XOR) gates, each of said XOR logically processing signals indicative of said SUT exhibiting adjacent ones of said N threshold levels;
wherein each of said XOR gates is used to select a respective one of N rows of counters within said array of counters.

20. The apparatus of claim 19, further comprising:
a sweep mechanism, for sequentially selecting each one of M columns of counters within said array of counters during a sweep period.

21. The apparatus of claim 20, wherein said sweep period is adapted in response to a user input signal.

22. The apparatus of claim 19, wherein:
said sweep mechanism in enabled only when a trigger condition is satisfied.

23. The apparatus of claim 19, further comprising:
a plurality of delay lines, each of said delay lines adapted to delay the communication XOR gate output signals to corresponding counter array rows.

24. The apparatus of claim 19, further comprising:

a controller, for retrieving count data from said array of counters and processing said count data to provide an image-representative signal suitable for use by a display device;

each counter within said counter array having associated with it a count representing at least a luminance level of a corresponding picture element (pixel).

* * * * *